United States Patent
Blumberg

(10) Patent No.: US 7,690,157 B2
(45) Date of Patent: Apr. 6, 2010

(54) SECURE DATA CENTER HAVING REDUNDANT COOLING AND BLAST PROTECTION FOR PROTECTING COMPUTER SERVERS BY THE POSITIONING OF AIR HANDLING UNITS, FIBER OPTIC CABLE AND A FIRE SUPPRESSION SYSTEM

(76) Inventor: Marvin R. Blumberg, 7105 Broxburn Dr., Bethesda, MD (US) 20817

( * ) Notice: Subject to any disclaimer, the term of this patent is extended or adjusted under 35 U.S.C. 154(b) by 0 days.

(21) Appl. No.: 12/149,326

(22) Filed: Apr. 30, 2008

(65) Prior Publication Data

US 2009/0000243 A1 Jan. 1, 2009

Related U.S. Application Data

(63) Continuation of application No. 10/811,147, filed on Mar. 29, 2004, now abandoned.

(60) Provisional application No. 60/458,044, filed on Mar. 28, 2003.

(51) Int. Cl.
*E04C 2/52* (2006.01)
*E04B 7/00* (2006.01)
(52) U.S. Cl. .......................... 52/22; 52/220.1
(58) Field of Classification Search ............. 52/22, 52/79.1, 220.1, 220.6
See application file for complete search history.

(56) References Cited

U.S. PATENT DOCUMENTS

| | | | | |
|---|---|---|---|---|
| RE20,851 E | * | 9/1938 | Wood | 52/264 |
| 2,767,961 A | * | 10/1956 | Frankland | 165/49 |
| 3,720,258 A | * | 3/1973 | Chandler | 165/213 |
| 3,818,814 A | * | 6/1974 | Obler et al. | 454/335 |
| 3,908,321 A | * | 9/1975 | Cox et al. | 52/79.14 |
| 3,935,897 A | * | 2/1976 | Pulver | 165/49 |
| 4,012,875 A | * | 3/1977 | Hirsch | 52/168 |
| 4,498,526 A | * | 2/1985 | Arenas | 165/45 |
| 4,513,545 A | * | 4/1985 | Hopkins, Jr. | 52/79.1 |
| 4,783,137 A | * | 11/1988 | Kosman et al. | 385/53 |
| 5,168,145 A | * | 12/1992 | Tackett et al. | 219/243 |
| 5,271,585 A | * | 12/1993 | Zetena, Jr. | 248/49 |
| 5,572,183 A | * | 11/1996 | Sweeney | 340/332 |
| 6,049,647 A | * | 4/2000 | Register et al. | 385/101 |
| 6,374,627 B1 | * | 4/2002 | Schumacher et al. | 62/259.2 |
| 6,557,624 B1 | * | 5/2003 | Stahl et al. | 165/53 |
| 6,574,104 B2 | * | 6/2003 | Patel et al. | 361/695 |
| 6,672,955 B2 | * | 1/2004 | Charron | 454/184 |
| 6,702,512 B1 | * | 3/2004 | Reale | 404/6 |
| 6,859,366 B2 | * | 2/2005 | Fink | 361/690 |
| 6,871,470 B1 | * | 3/2005 | Stover | 52/648.1 |
| 2002/0073628 A1 | * | 6/2002 | Dextras | 52/1 |
| 2002/0139056 A1 | * | 10/2002 | Finnell | 52/1 |
| 2002/0191936 A1 | * | 12/2002 | Daoud et al. | 385/134 |
| 2004/0099747 A1 | * | 5/2004 | Johnson et al. | 236/49.3 |
| 2005/0170770 A1 | * | 8/2005 | Johnson et al. | 454/184 |
| 2006/0234621 A1 | * | 10/2006 | Desrochers et al. | 454/239 |
| 2008/0236070 A1 | * | 10/2008 | Serinet | 52/234 |

* cited by examiner

*Primary Examiner*—Michael Safavi
(74) *Attorney, Agent, or Firm*—Jacobson Holman PLLC

(57) ABSTRACT

A data center is contained within a building which includes protection from vandalism, high winds, earthquake, and storms. Circulated water within the building is used for cooling or fire suppression. Explosions emanating from inside or outside of the building are protected against by the construction components of the building containing the data center.

6 Claims, 8 Drawing Sheets

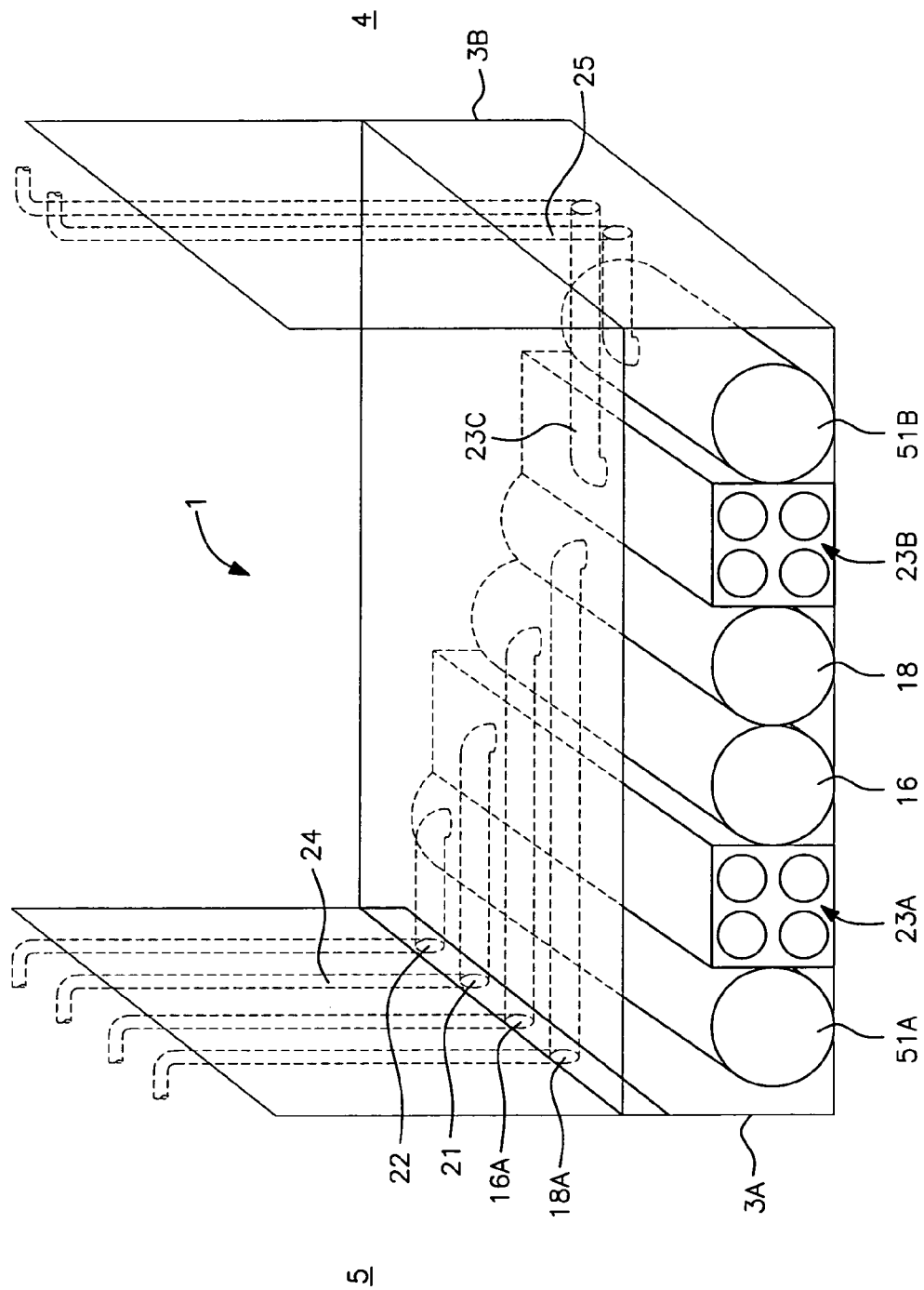

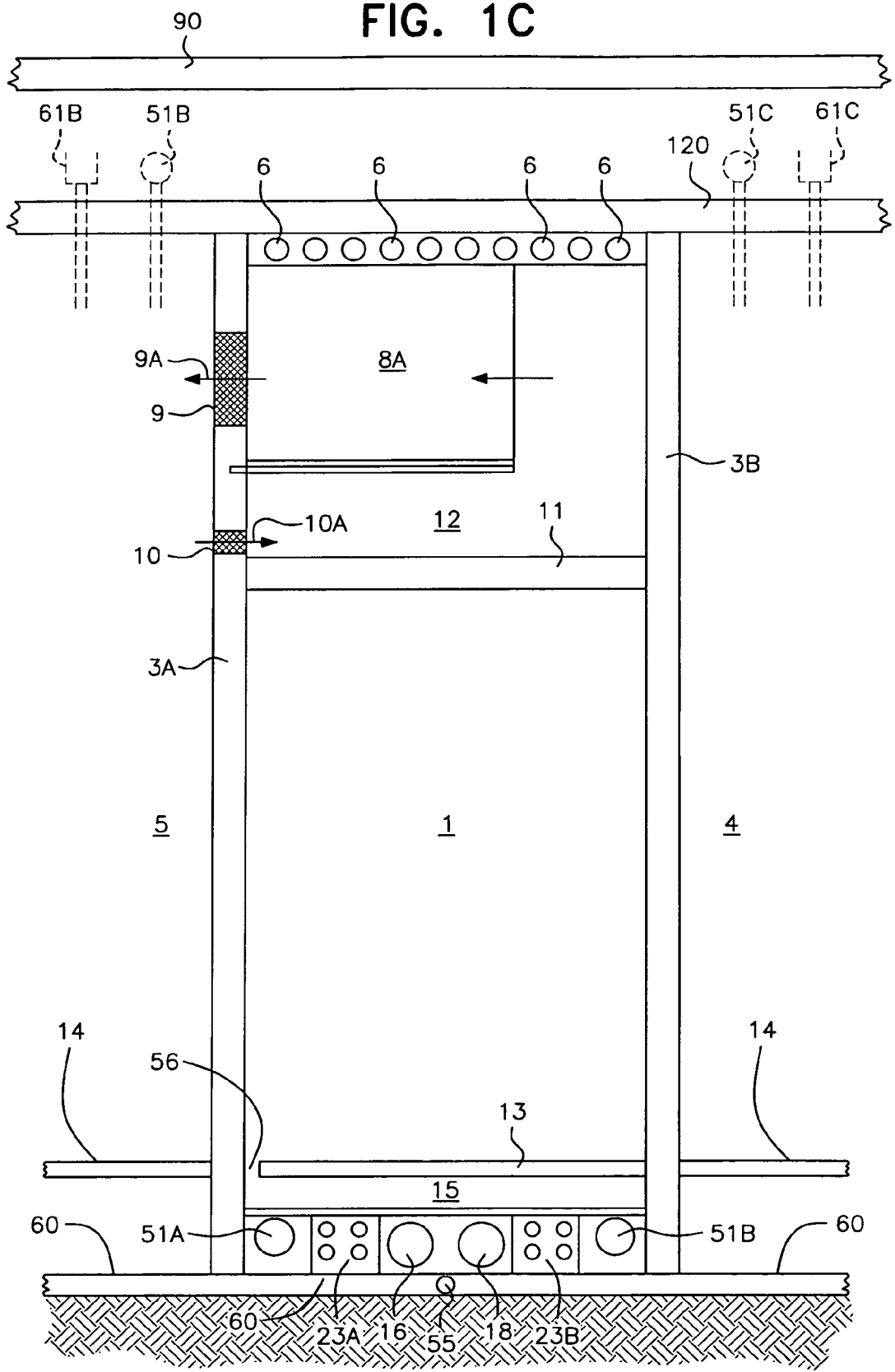

SECURE DATA CENTER HAVING REDUNDANT COOLING AND BLAST PROTECTION FOR PROTECTING COMPUTER SERVERS BY THE POSITIONING OF AIR HANDLING UNITS, FIBER OPTIC CABLE AND A FIRE SUPPRESSION SYSTEM

CROSS-REFERENCE OF RELATED APPLICATIONS

This application is a continuation of U.S. application Ser. No. 10/811,147 filed Mar. 29, 2004, now abandoned. U.S. application Ser. No. 10/811,147 claims priority from and the benefit of U.S. Provisional Application Ser. No. 60/458,044, filed on Mar. 28, 2003, now expired, and is hereby incorporated in its entirety by reference.

FIELD OF THE INVENTION

This application relates to improvements to data centers, including protection from: (1) vandalism, (2) high winds, (3) earthquake, (4) storms, (5) water or gas used for cooling or fire suppression, and (6) explosions emanating from inside or outside of the building.

BACKGROUND OF THE INVENTION

A data center is a facility designed to house computer equipment (servers, routers, etc.) The computer equipment is used to store data, receive data from other computers and send data to other computers located inside and outside of the facility. The data is transmitted through copper and fiber optic transmission lines. In order for the data center to have a high level of reliability, all aspects of the design of the data center are important.

The physical security includes protection for: (1) electrical, mechanical, and computer equipment, (2) the power distribution system, (3) the copper and fiber optic distribution system, and (4) pipes and ducts for the mechanical system.

The security system should provide protection from: (1) vandalism, (2) high winds, (3) earthquake, (4) storms, (5) water used for cooling or fire suppression, and (6) explosions emanating from inside or outside of the building.

The reliability of the design is enhanced by redundancy so that if there is an equipment failure, another piece of equipment will function without delay to replace it. The reliability of the data center is also improved by the compartmentalization of the design so that if there is an equipment failure, the impact of the failure is limited in scope. Reliability is also improved by having a design which makes a fast recovery possible, such as a design which makes the quick and easy replacement of the equipment (or a part within the equipment) possible.

The reliability of the design is also enhanced by having a design which attempts to eliminate a shut down because of a single point of failure. However, if there is a single point of failure, it is important that the component causing the failure is (1) very unlikely to fail, (2) the component can be replaced quickly if it does fail, and (3) the impact of such a failure is limited.

SUMMARY OF THE INVENTION

The design of the present invention incorporates the aspects described above (physical security, redundancy, compartmentalization, fast recovery, and the elimination of the "single point of failure") in an effort to achieve the highest level of reliability.

The following discussion of the mechanical system, the power distribution system, and the fiber optic distribution system are preferably in a building where the roof and outer walls are protected to withstand the impact of high winds or a blast from an explosive. However, there are aspects to the design which would be advantageous to buildings without such protection. For example, the mechanical system requires less floor space.

In the description of the design that follows it is assumed that there are one or more corridors with rooms on both sides of the corridor. (The design also applies if there are rooms on only one side of the corridor or if computer racks are located in a single large room.)

Racks which hold computer servers are placed in the plurality of rooms. It is necessary to supply these rooms with the following:

(1) Cooling to offset the heat generated by the servers and other electronic equipment.
(2) Electrical power to the electronic equipment.
(3) Fiber optic and copper lines to the equipment for the transmission of data.
(4) Humidity control to the room to control static electricity.
(5) Fire suppression system which may include INNER-GIN™ breathable gas fire suppression system.

These and other objects of the invention, as well as many of the intended advantages thereof, will become more readily apparent when reference is made to the following description taken in conjunction with the accompanying drawings.

BRIEF DESCRIPTION OF THE DRAWINGS

FIG. 1B shows the connections to the lines located below grade in FIG. 1A.

FIG. 1C is an alternate design of a distribution system, similar to FIG. 1A.

DETAILED DESCRIPTION OF THE PREFERRED EMBODIMENTS

Figure 1A:
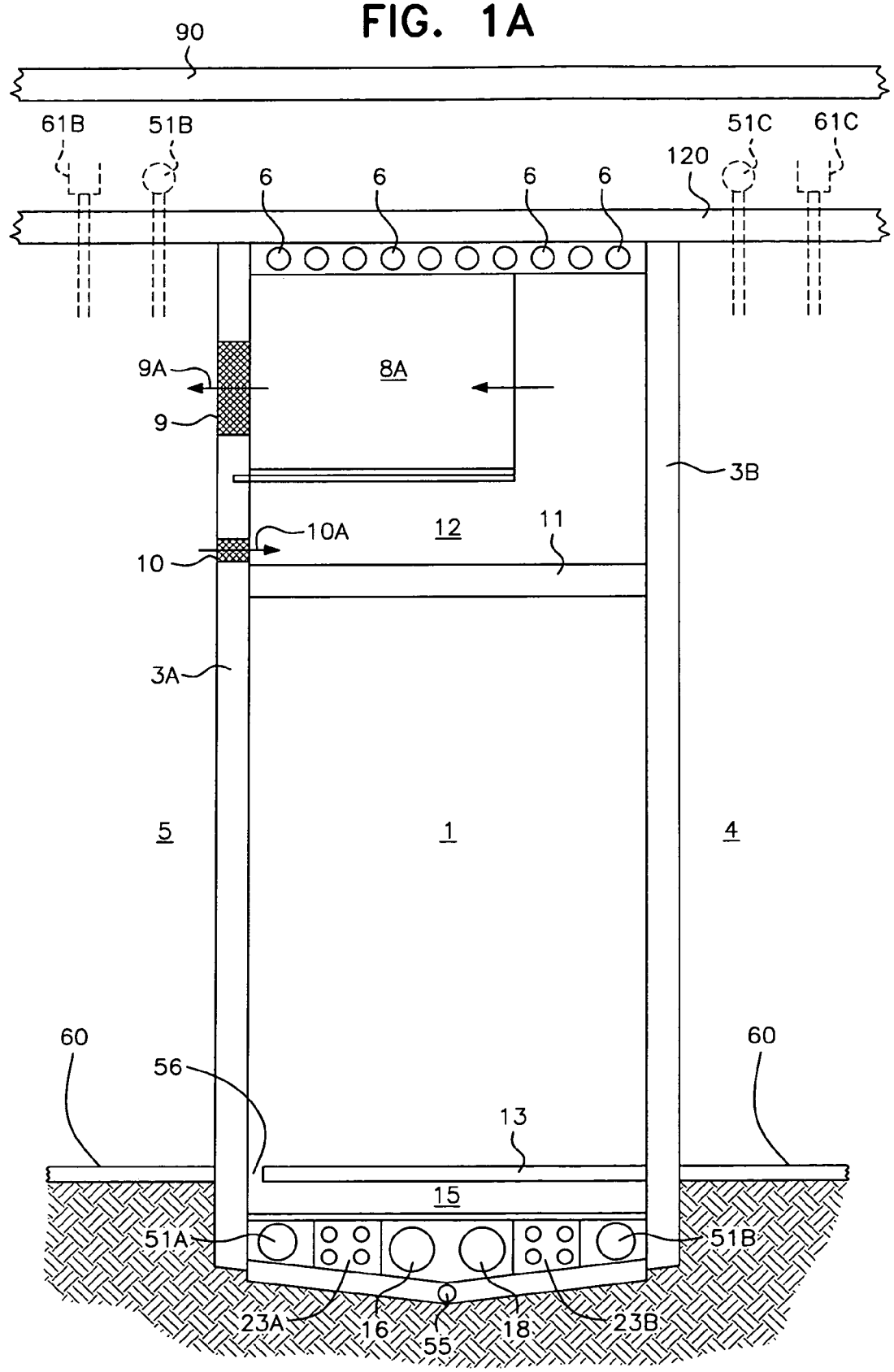
FIG. 1A shows the design of a corridor space for mechanical equipment, distribution of chilled water to mechanical equipment, location of electric cable which supplies power to the power distribution units (PDUs) which are connected to servers, and fiber optic lines which are connected to the servers located in the rooms.

In describing a preferred embodiment of the invention illustrated in the drawings, specific terminology will be resorted to for the sake of clarity. However, the invention is not intended to be limited to the specific terms so selected, and it is to be understood that each specific term includes all technical equivalents which operate in a similar manner to accomplish a similar purpose.

Figure 3A:
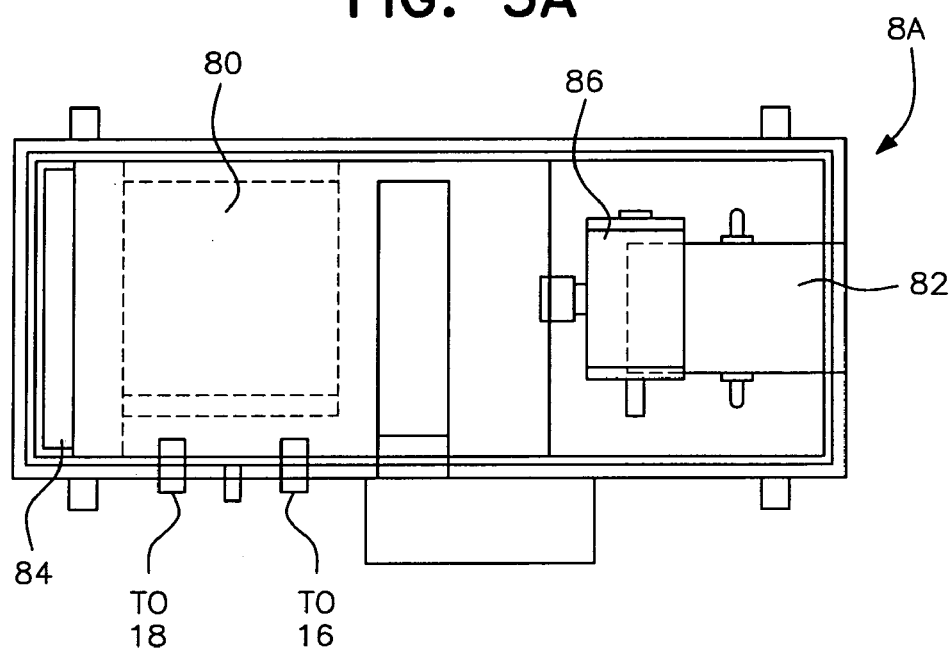
FIG. 3A and FIG. 3B show a plan view and vertical section of an AHU.
Figure 3B:
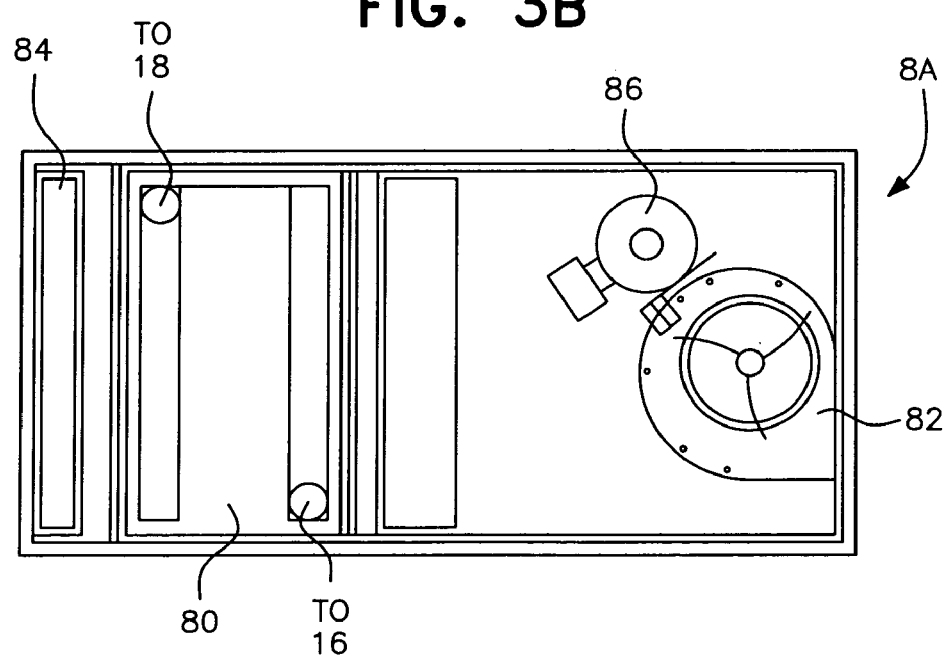

A space 12 (FIG. 1A) is located above the corridor 1 between the foil coiling unit (FCU) or Air Handling Unit (AHU) 8A having a coil 80, a fan 82 and filter 84 (as shown in FIGS. 3A and 3B). Between the walls 3A, 3B is a ceiling tile and grid system 11 of the corridor sufficient to provide the required return air to the AHU in space 12.

A plurality of individual FCUs could be replaced by a large FCU located at ground floor level 60 which would blow cool air into a ducted system 73 going down the space where AHU 8A is located between walls 3A, 3B, secondary roof 120 and tile and grid system 11.

Below the raised floor 13 of the corridor 1 there is a space 15, FIG. 1A and FIG. 1B, through which pipes can be located and connected to the risers in the walls or to a pipe connected to an AHU located on a raised floor or concrete deck (see FIG. 1A and FIG. 1B). Also, connecting pipes extend from the chilled water supply pipe 16 and chilled water return pipe 18, FIGS. 1A, 1B, 1C.

In the alternative the fiber optic trays 61B, 61C and cylinders 51B and 51C for the fire suppression system can be located above the secondary roof 120 on both sides of the corridor 1 as shown in FIGS. 1A and 1C, in dotted lines. In FIG. 1B pipes cross the corridor 1 and are connected to risers which are located in corridor walls 3A and 3B. FIG. 1A also includes a condensate drain pipe 55 from a pipe extending down a wall for the AHU.

FIG. 1B shows the staggered connections from the chilled water return (CWR) pipe 16A to the wall 3A and from the chilled water supply pipe 18A to the wall 3A. FIG. 1B also shows fiber optic line 21 from the conduit extending to the conduit box 23A passing through the conduit to the riser 24 and into adjacent room 5. This fiber optic line extends into adjacent room 5 from the risers in the wall. The fiber optic line 23C extending from conduit box 23B, FIG. 1B, is for the room 4 across the corridor from room 5. Cylinder 51B, shown in solid lines in FIGS. 1A, 1B and 1C, is for fire suppression for room 4 by pipe line 25. Cylinder 51A, shown in solid lines in FIGS. 1A, 1B and 1C, is for fire suppression for room 5 by pipe line 22.

FIG. 1A shows a secondary roof 120 which spans the corridor and the rooms 4 and 5 on both sides of the corridor 1. The secondary roof 120 is below building roof 90. There is limited access to the secondary roof 120. Motion detectors and closed circuit television monitors provide continuous surveillance of the secondary roof. The secondary roof protects against roof leakage from the primary building roof 90. A slope of secondary roof 120 is a 1) blast protection, 2) secondary rain protection and 3) covering for fiber and electrical distribution lines.

Figure 2:
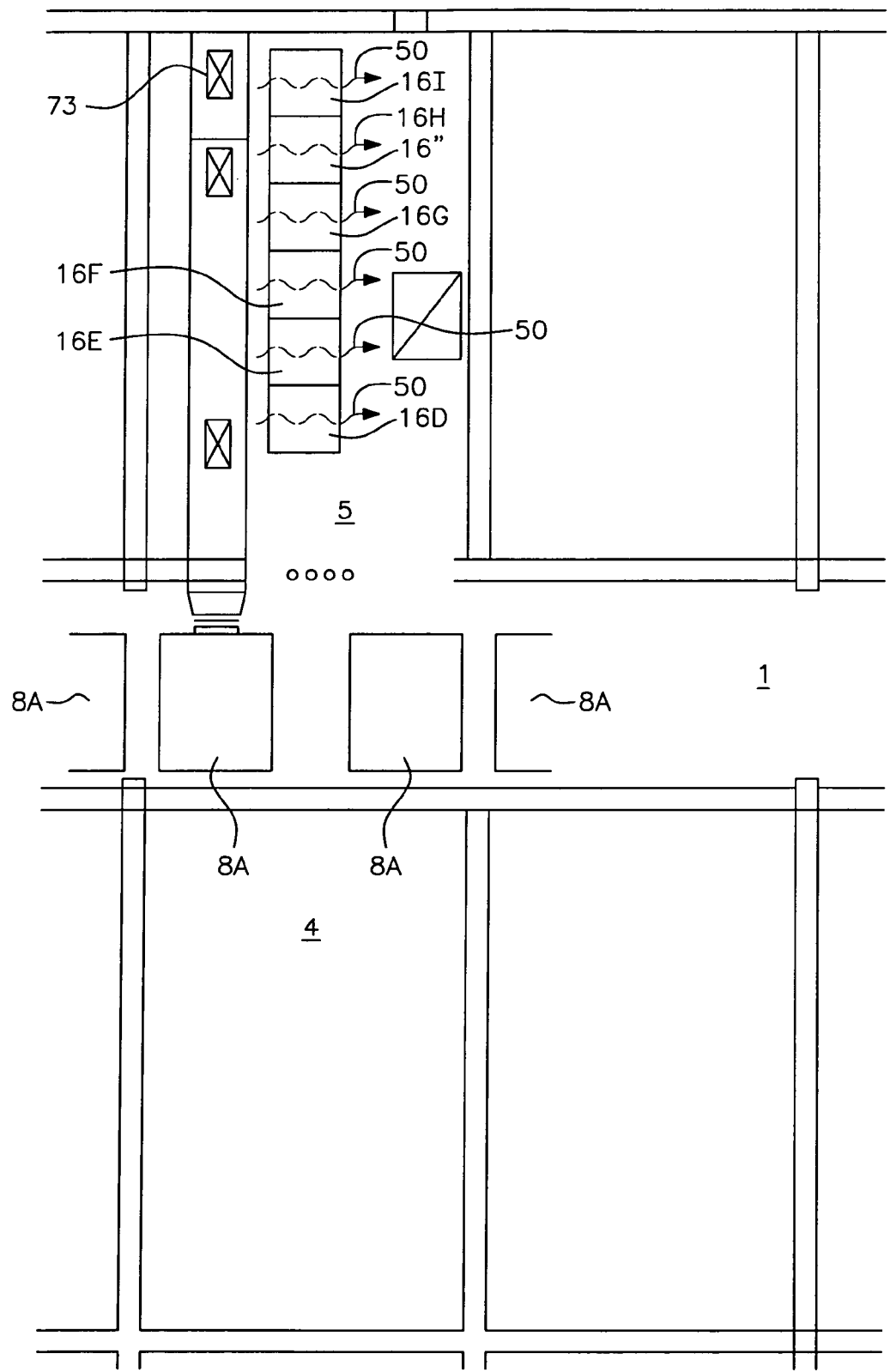
FIG. 2 shows a plan view of air handling units (AHU) in the corridor and the ducts which supply the rooms on each side of the corridor.

The walls 3A and 3B enclose the sides of the corridor 1. Below the secondary roof 120, conduits 6 carry the power cable from the uninterrupted power supply (UPS) units to the power distribution units (PDU) and then to each room, e.g. rooms 4 and 5, for powering lighting and critical load including servers, routes, etc., where the servers in racks 16D-16I (FIG. 2) and other electronic equipment are placed.

The AHU 8A, FIG. 1A, is located below the conduits 6. The AHU 8A abuts corridor wall 3A, and supplies cool air in the direction of arrow 9A to the room 5 through the supply air grill 9. The return air transfer grill 10 permits air to return from room 5 to the AHU 8A in the direction of arrow 10A. The ceiling tile and grid system 11 along with the walls 3A and 3B, the corridor 1, the space below the AHU and the space between the fan coil units (FCU) create a return air space which is required for the cooling unit.

The cooling capacity of the AHU is determined by the size of the motor and fan, the cooling capacity of the coils, and the volume of air that can be returned to the AHU. The volume of air that can be returned to the FCU is determined as shown in FIG. 3A by calculating the volume of air available in the space between the bottom of the structure and the top of ceiling tile and grid system 11 and the width of the space, from center to center, between the air handling units.

The condensate drain pipe 55 is located at the bottom of the corridor 1. The condensate drain drains any water that gets into the corridor. There is a small space 56 between the corridor walls and the raised floor 13 to allow for any water that gets into the corridor to drain.

Figure 4A:
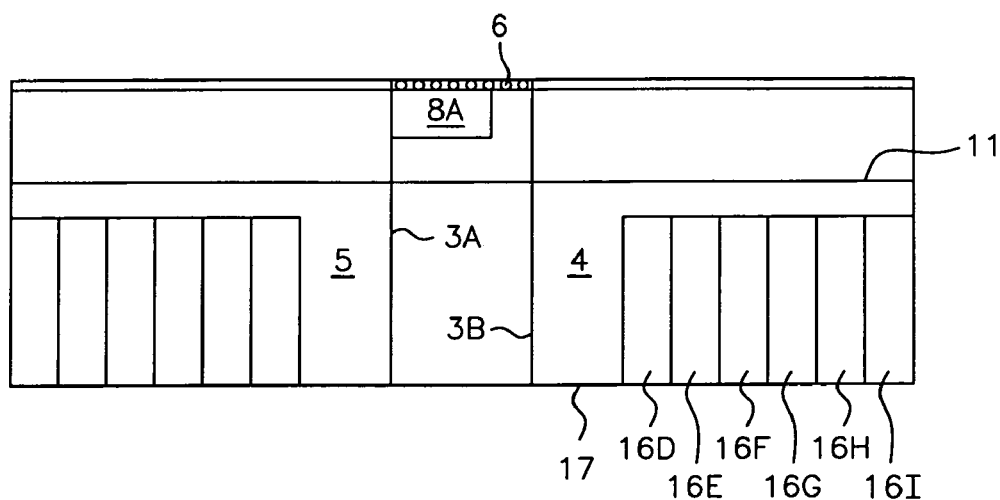
FIGS. 4A and 4B show a vertical section and a plan view, respectively, of a six foot wide and eight foot high (or higher) central corridor and lateral room enclosures.
Figure 4B:
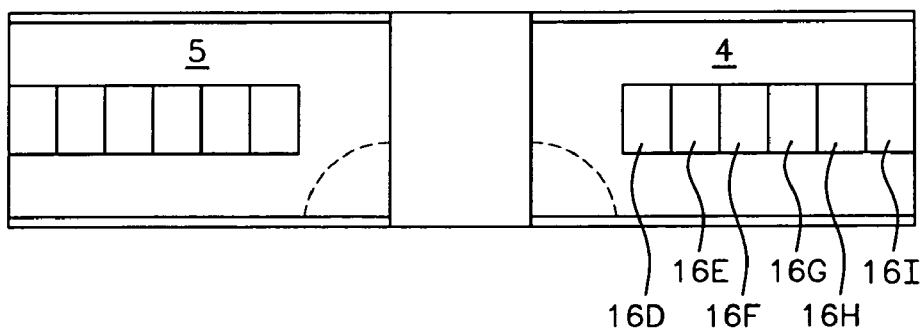

FIGS. 4A, 4B show a vertical section and a plan view section, respectively, of a corridor 6 feet wide and approximately 8 feet or more high from the ceiling tile and grid system 11 to the floor 17. A four ton FCU 8A is located between the power conduits 6 and the ceiling tile and grid system 11. There are six racks 16D-16I in rooms 4 and 5 in FIGS. 2, 4A, and 4B. Typically, each rack, in this example, requires 20 amps at 120 volts (120V×20 A=2400 watts=2.4 KVA) (1 ton=12,000 BTU) (heat of 1 KVA=3416 BTU) (2.4 KVA requires 8116 BTU). One ton of cooling will therefore cool 1½ racks.

Therefore, the six racks at 20 amps per rack each require four tons of cooling. The FCU in FIG. 1A is a four ton unit. This unit is 48% inches on the side and 24 inches across the front (the supply register side).

Figure 5:
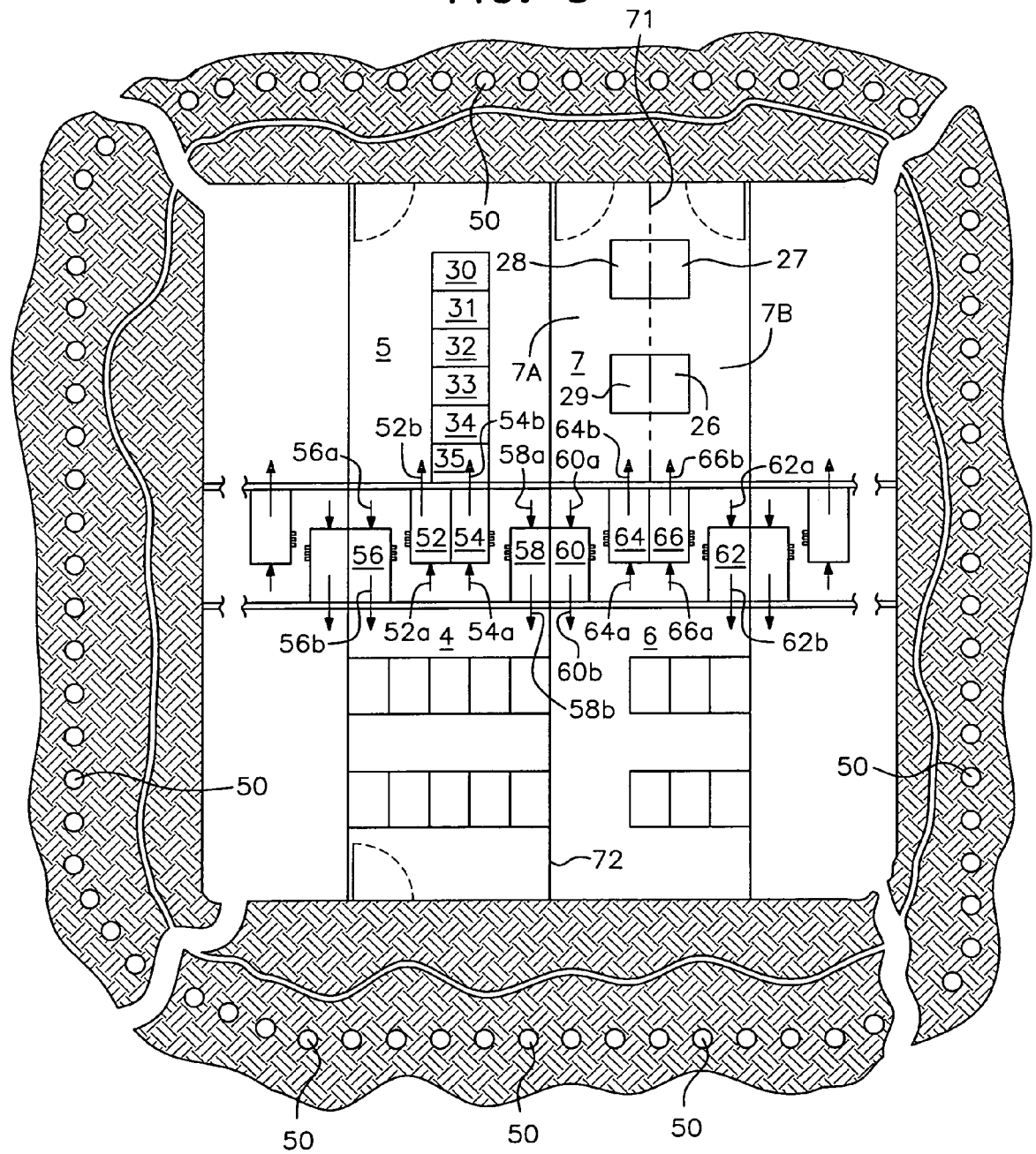
FIG. 5 shows a plan view of AHUs assigned to four different room configurations.

Two of these units 52, 54 are shown in FIG. 5, designated for room 5 and two of these units 56, 58 are shown designated for room 4. Rooms 4 and 5 each have available two, four ton units for a total of eight tons. This equates to full redundancy if each rack is using only 20 amps at 120 volts. If each rack is using 40 amps then in the event of a failure of one of the AHUs, a fast recovery is necessary.

The components in an AHU are a motor 86 connected to a fan 82 and a cooling coil 80. These components have a low failure rate and can be quickly replaced if the unit has valves for the quick removal of the cooling coil and replacement parts for the motor. Extra fans and cooling coils are kept on hand. In addition, monitoring of the temperature in the room and monitoring of the other parts should alert personnel to projected failure to minimize the impact of such a failure.

FIG. 5 shows a top view of the AHUs assigned to rooms 4, 5, 6 and 7. Room 6 includes AHUs 60, 62 and room 7 includes AHUs 64, 66. Additional rooms to the sides of rooms 4, 5, 6 and 7 are for illustrative purposes only. The arrows 52a, 52b, 54a, 54b, 56a, 56b, 58a, 58b, 60a, 60b, 62a, 62b, 64a, 64b, 66a, 66b show the direction of the air through the units 52-66. If each of the units 52-66 is four tons then eight tons are assigned to each room.

A room can be subdivided by a wall 71 into two rooms, e.g., see FIG. 5, rooms 7A and 7B. In that case, each room could have either one (AHU 29 in room 7A, AHU 26 in room 7B) or two (AHUs 28, 29 in room 7A, AHUs 26, 27 in room 7B), four ton AHUs. If a room is not subdivided it is shown to be approximately 10 feet×16 feet (including partitions). If subdivided the two rooms 7A, 7B would each be approximately 5 feet×16 feet and each room could have assigned to it one, four ton AHU. FIG. 5 shows that when rooms 4 and 6 are combined by removal of wall 72, sixteen racks are placed in the space (an increase of four racks over the rooms of six racks each).

As shown in FIG. 5, room 5 has six racks 30-35. Two KVAs can be supplied to each rack with one four ton AHU. With two, four ton units to each room, 10 feet×16 feet, four KVAs can be supplied to each rack or a second two ton unit can be used to supply A.C. "back up" for the room.

The building is surrounded by bollards 50 at a standoff distance of a minimum of 90 feet from the building. Examples of bollards 50 are shown on one side of the building only in FIG. 5. It is understood that the bollards 50 would surround the building as shown schematically in FIG. 5.

The bollards are built to the highest Department of Defense (DOD) standard. At that standoff distance, the buildings will withstand a blast from 1000 pounds of TNT on a 5000 pound truck moving at 50 miles per hour. The brick exterior of the building is backed up by 12 inch reinforced concrete masonry unit (CMU) with grout in the CMU cavities. The interior walls of the rooms are built of 8 inch and 12 inch CMUs which are reinforced with steel bars and the CMU cavities are filled with grout. The secondary roof 120 is built of steel and concrete so that the interior of the building is protected against blast.

The building is built in a highly secure manner. This physical security provides security to the AHU, the power distribution units, the uninterruptible power supply, the batteries, the switch gear, the computers, routers and other electronic equipment, the power distribution system, the fiber distribution system, the copper distribution system (for data), the chilled water supply and return pipes, the fire suppression system and all the other equipment protected by the walls and roof of the building.

The system disclosed herein is appropriate for a building designed and built to the concept disclosed for a building converted to a data center. For instance, a building with an interior space 22 feet in height can have an additional mezzanine floor added to accommodate the tanks for a fire suppression system and the electrical and fiber distribution system described herein.

In an existing building, preferably, existing or new construction would have a roof sloping at a 2% grade to help carry off rainwater. The secondary roof 120 may be built parallel to the existing roof (i.e., the same slope) approximately 5 feet below the existing roof and can be built of steel and concrete (a composite deck). Twelve inch steel reinforced concrete masonry units can be added to the inside of the building perimeter and shear walls can also be built of twelve inch CMU. The bollards, the secondary roof, the exterior walls and the shear walls will protect the building against the blast described above.

The rooms for the servers may also be built of reinforced CMU. This will give the equipment in these rooms further protection against a satchel charge in the interior or near the exterior of the building. The concrete slab of the existing building can be cut and a trench built so that the chilled water pipes and fiber optic could be installed.

The cylinders for the gas fire suppression may be placed on the secondary roof directly above the rooms that will receive the gas in the event of a fire or in the trench below the raised floor as shown in FIGS. 1A and 1B. In either case, the gas will be confined to the room for which it is designated which gives additional protection against putting too much gas into the room.

Figure 6:
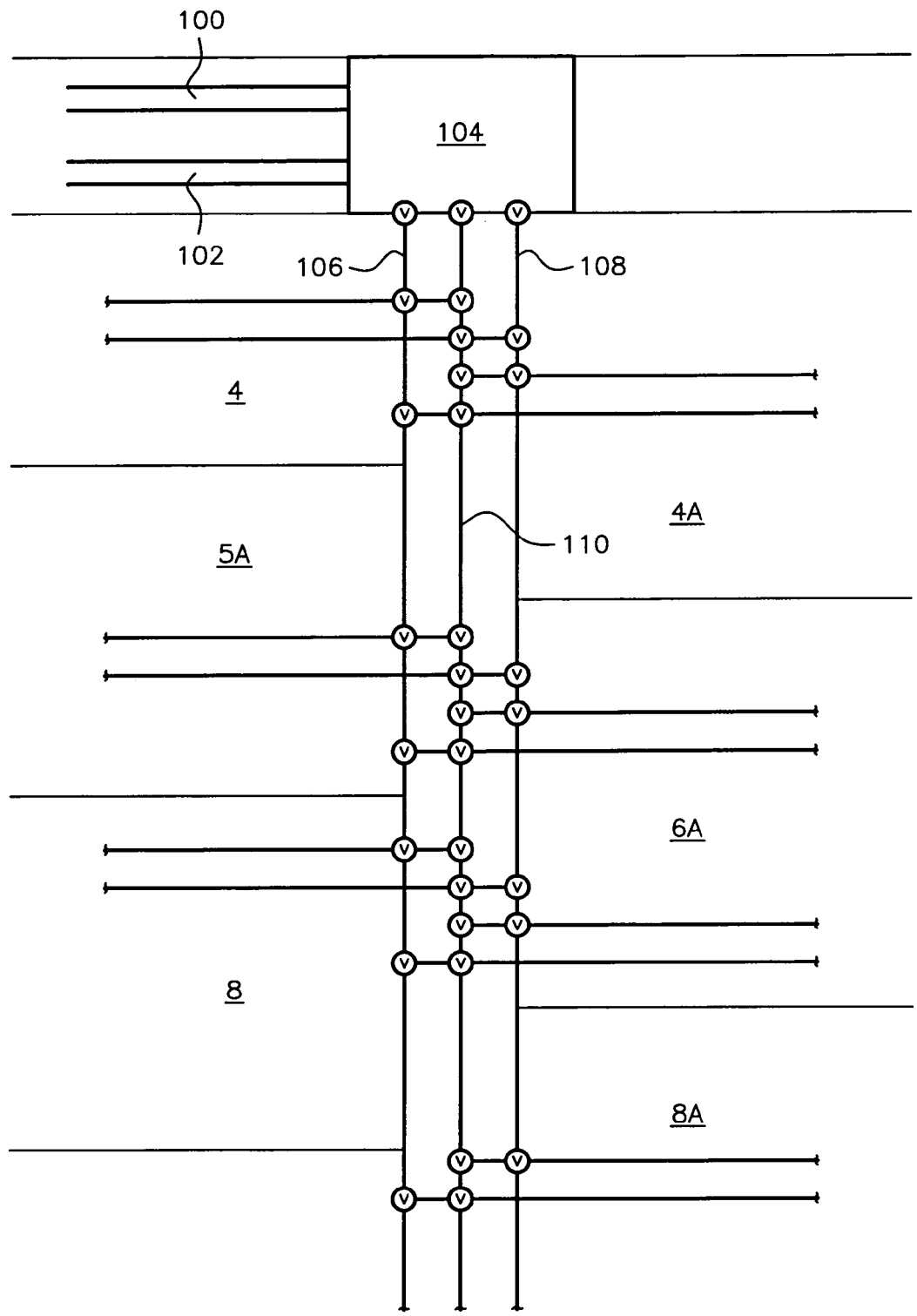
FIG. 6 is a plan view of a piping diagram with a third pipe provided for maintenance or replacement of either one of the other two pipes.

The chilled water supply pipes are designed so that valves may be closed which prevent water from flowing through them. The water can be drained from them and then a leak can be repaired. When these valves are closed, other valves can be opened which are connected to a "back up" supply line as shown in FIG. 6 so that the air handling unit still receives chilled water. A similar piping system would be used for the return chilled water system. The same back-up pipe can be used for both the return and supply chilled water system if similar valves are closed and opened.

FIG. 6 shows 14 inch chilled water supply 100 and return 102 from the pump room 104. 4 inch chilled water supply 106 and return 108 lines are then connected to the 14 inch chilled water lines to serve rooms 4, 4A, 5A, 6A, 8 and 8A, for example. An additional 4 inch pipe 110 is placed in each corridor to take the place of any section which is closed off by valves so that the closed section can be repaired. See valves V in FIG. 6.

The preferred configuration of this data center design will provide that (1) the electrical distribution to the racks and PDU rooms will be located between the AHU 8A and the secondary roof 120 and above the secondary roof 120, in a secured steel tray attached to the secondary roof with a space for the flow of water if there is a leak in the primary building roof 90. (2) The fire suppression system will be provided by INNERGIN™ gas located in cylinders located above the secondary roof and above the space being protected. (3) The chilled water supply and return pipes will be located in the corridors below the raised floor in a trench with a drain beneath these pipes and a water tight separation to the adjacent rooms. (4) Racks located in a small room will receive conditioned air from an AHU in the corridor. (5) Rack in large rooms with a heavy A.C. load will have the AHU on a raised floor 14 with the supply air moving under the raised floor to the racks. (6) The bollards, the walls of the building and the shear walls and the secondary roof and the primary roof structure will provide protection against blast to the highest Department of Defense standards.

The chilled water pipes, fiber and electrical conduit can be located in a trench in the corridor and the top of the raised floor 13 can be level with the concrete slab 60 adjacent to the corridor (see FIG. 1A). In the alternative, FIG. 1C, the space 15, can be located between the walls 3A and 3B, the raised floor 13 and the slab 60. In that case, the raised floor 14, would be located on each side of the corridor walls. In that case, the rooms on each side of the corridor would have raised floors and the supply ducted system 73 shown in FIG. 2 would have a vertical section so that the supply air would be extended down in the corner of the room so that the supply air would pressurize the space below the raised floor, and the cold air 50 could then be supplied below the racks 16D-16I in FIG. 2.

There is sufficient space above the secondary roof that the fiber optic lines can be laid out so that they do not cross the power distribution lines. The power lines which are intended to be dropped through the secondary roof to the cage below would be located at the front of the cage and the fiber lines would be located at the rear of the cages.

Some other advantages of the design are:
1. The electric power and the fiber are kept more than the required distance apart.
2. The fiber and low voltage copper data lines are located in a secure space below the raised floor, or above the secondary roof. In either case, it can be secured in a steel tray with a locking device and a monitoring device for surveillance.
3. The fan coil units do not require room floor space. This raises the efficiency of the use of the floor area of the building.
4. In addition to providing security against blast, the secondary roof provides redundancy with respect to protection from roof leaks and an excellent place to run additional fiber and power.
5. A normal duct system in the corridors which are then connected to the rooms can be tapped so that conversations in the rooms could be heard by those not intended to be privy to such conversations. The chilled water system described herein is not subject to such intrusion.

6. This design is intended to meet federal security (SCIF) requirements.

The foregoing description should be considered as illustrative only of the principles of the invention. Since numerous modifications and changes will readily occur to those skilled in the art, it is not desired to limit the invention to the exact construction and operation shown and described, and, accordingly, all suitable modifications and equivalents may be resorted to, falling within the scope of the invention.

I claim:

1. A data center comprising:
   a secure structure for protecting contents of the structure against equipment failure and explosions said structure having a floor and a corridor, said corridor extending between at least two rooms located on opposite sides of the corridor, said at least two rooms including computer racks for supporting a plurality of computer servers,
   an explosion protection system surrounding the structure the explosion protection system including a plurality of bollards, spaced at least 90 feet from the structure,
   a primary roof of the structure,
   a secondary roof inside the structure spanning the corridor and the at least two rooms, said secondary roof being located below said primary roof and spanning an interior of the structure at a constant separation distance from the primary roof,
   a plurality of air handling units located entirely below said secondary roof and above a ceiling system located in the corridor, said ceiling system being located above a floor of the structure,
   at least two separate ones of the air handling units communicating with each of the at least two rooms, respectively, so that every room includes at least two distinct air handling units, and
   a distribution system for chilled water supply and return pipes and communication lines being located below the floor of the structure and below the corridor and including a connection through walls of the corridor to extend above the secondary roof,
   said secondary roof supporting fiber optic cable and a fire suppression system, said fiber optic cable and fire suppression system being located above the secondary roof and extending through space between the primary roof and the secondary roof and into the at least two rooms.

2. The data center as claimed in claim 1, wherein the distribution system further includes another fire suppression system.

3. The data center as claimed in claim 1, wherein the distribution system further includes a chilled water supply line and a chilled water return line.

4. The data center as claimed in claim 3, wherein the chilled water supply line and the chilled water return line are connected by valves to a bypass water line for use in the event of maintenance or failure of one of the chilled water supply line and the chilled water return line.

5. The data center as claimed in claim 1, wherein motion detectors provide surveillance of the secondary roof.

6. The data center as claimed in claim 1, wherein closed circuit television monitors provide continuous surveillance of the secondary roof.

* * * * *